United States Patent [19]

Shiga

[11] Patent Number: 5,164,686

[45] Date of Patent: Nov. 17, 1992

[54] HIGH-FREQUENCY OSCILLATOR HAVING A FIELD-EFFECT TRANSISTOR WITH A STEPWISE INCREASING ACTIVE LAYER CARRIER CONCENTRATION

[75] Inventor: Nobuo Shiga, Yokohama, Japan

[73] Assignee: Sumitomo Electric Industries, Ltd., Japan

[21] Appl. No.: 791,738

[22] Filed: Nov. 15, 1991

[30] Foreign Application Priority Data

Nov. 16, 1990 [JP] Japan .................................. 2-311059

[51] Int. Cl.$^5$ ............................................. H03B 5/00
[52] U.S. Cl. ................................. 331/99; 331/117 D; 331/117 FE
[58] Field of Search ............ 331/96, 107 SL, 117 FE, 331/117 D

[56] References Cited

U.S. PATENT DOCUMENTS 4,707,669 11/1987 Mekata et al. .................. 331/117 D

*Primary Examiner*—Robert J. Pascal
*Attorney, Agent, or Firm*—Beveridge, DeGrandi & Weilacher

[57] ABSTRACT

This invention is a high-frequency oscillator including a MESFET, wherein a GaAs MESFET, in which the doping profile of an active layer has a pulse-doped structure, is used as the MESFET. Since the GaAs MESFET is formed to have the pulse-doped structure, the change in transconductance with respect to the change in gate resistance remains constant at gate voltages within a predetermined range. When the gate voltage is set to be a voltage within this predetermined range, a capacitance change with respect to a gate voltage across a gate and a source is reduced. FM noise proportional to the magnitude of this capacitance change is reduced. Accurate information transmission is not interfered with unlike in conventional arrangements.

5 Claims, 2 Drawing Sheets

HIGH-FREQUENCY OSCILLATOR HAVING A FIELD-EFFECT TRANSISTOR WITH A STEPWISE INCREASING ACTIVE LAYER CARRIER CONCENTRATION

BACKGROUND OF THE INVENTION

1. Field of the Invention

The present invention relates to a high-frequency oscillator for use in, e.g., a receiving circuit of a satellite communication system.

2. Related Background Art

Conventionally, a Schottky field-effect transistor (MESFET) consisting of GaAs (gallium arsenide) has been used in an amplifier section of a high-frequency oscillator of this type. This MESFET is formed on a monolithic microwave integrated circuit (MMIC) and constitutes a high-frequency oscillator together with circuit elements such as predetermined-length microstrip lines.

In the above conventional high-frequency oscillator, however, a large amount of phase noise (FM noise) is generated due to, e.g., $f^{-1}$ noise of the MESFET. Therefore, in a high-frequency oscillator using such a MESFET, accurate information transmission is sometimes interfered with by the FM noise.

SUMMARY OF THE INVENTION

It is an object of the present invention to provide a high-frequency oscillator which produces less FM noise.

In order to achieve the above object, a high-frequency oscillator according to the present invention comprises a MESFET, wherein the MESFET consists of GaAs, and a carrier concentration of an active layer of the MESFET increases stepwise at a predetermined depth.

A structure having such carrier concentration profile is referred as a "pulse-doped" structure hereinafter.

Since the GaAs MESFET is formed to have the pulse-doped structure, the change in transconductance with respect to the change in gate voltage is constant at a gate voltage within a predetermined range. Therefore, by setting the gate voltage of the MESFET to fall within this predetermined range, the change in capacitance with respect to a gate voltage across a gate and a source is decreased. As the capacitance change is decreased, FM noise is reduced.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
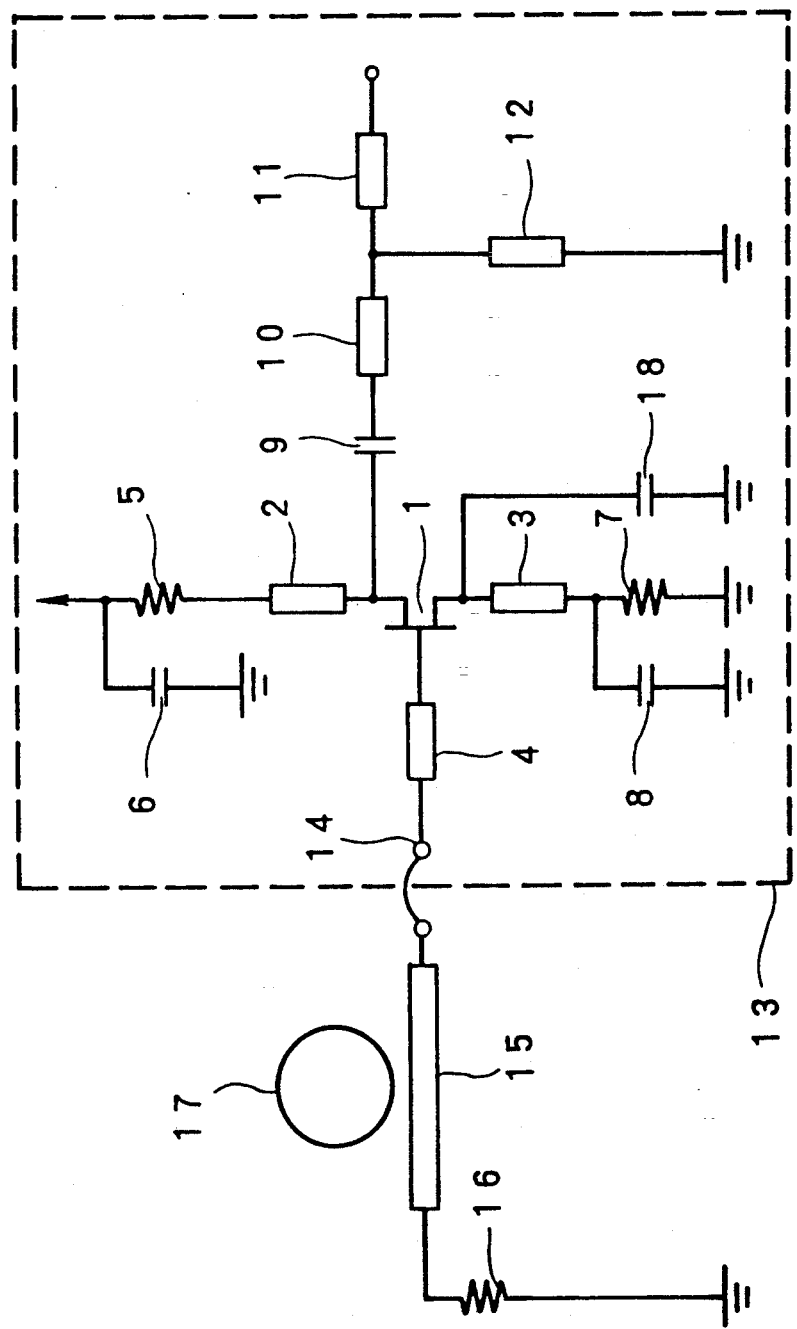
FIG. 1 is a circuit diagram showing an embodiment of a high-frequency oscillator according to the present invention.

Microstrip lines 2, 3, and 4 each having a predetermined shape are connected to the drain, source, and gate of a MESFET 1, respectively. The microstrip line 2 connected to the drain is connected to a resistor 5 having a terminal pulled up to a power source voltage. This resistor 5 is connected to a capacitor 6 having a grounded terminal. The source is connected to a capacitor 18 having a grounded terminal. The microstrip line 3 is connected to a resistor 7 and a capacitor 8, each having a grounded terminal. The drain of the MESFET 1 is connected to microstrip lines 10 and 11 via a capacitor 9. A microstrip line 12 having a grounded terminal is connected to a node between the microstrip lines 10 and 11.

The above arrangement is integrated in an MMIC 13. Outside the MMIC 13, a microstrip line 15 is connected to a terminal 14. The microstrip line 15 is connected in series with a resistor 16 having a grounded terminal. A dielectric resonator 17 is electromagnetically coupled to the microstrip line 15.

Figure 2:
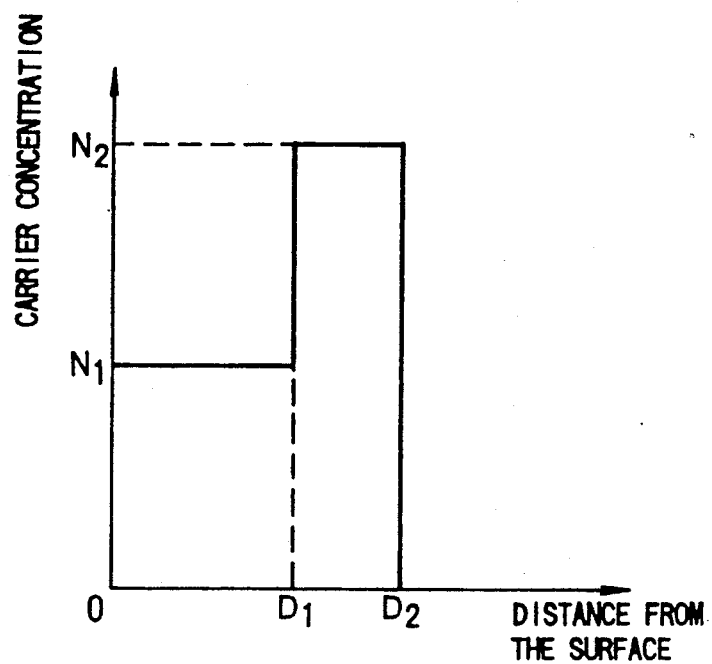
FIG. 2 is a graph showing a doping profile below the gate electrode of a pulse-doped structure FET.

The MESFET 1 is formed by epitaxial growth of a GaAs semiconductor material, and its active layer has a pulse-doped structure. That is, a doping profile below the gate electrode of the MESFET 1 is as shown in FIG. 2. Referring to FIG. 2, the abscissa indicates a distance from the surface to the interior of the GaAs semiconductor, and the ordinate indicates a carrier concentration. As graphically illustrated in FIG. 2, the carrier concentration remains at a concentration N1 from the surface to a predetermined depth D1 and increases stepwise to a concentration N2 in the predetermined depth D1. That is, the shape of the profile is analogous to that of a pulse, and carriers are trapped in a pulse-doped GaAs layer from the depth D1 to D2 at the concentration N2. Since this pulse-doped GaAs layer is applied to the active layer of the MESFET 1, high-frequency characteristics and noise characteristics are improved.

Figure 3:
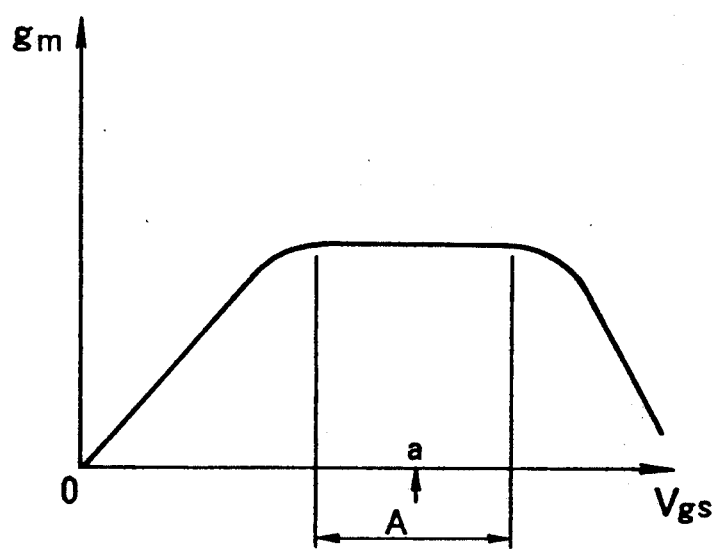
FIG. 3 is a graph showing the change in transconductance with respect to the change in gate voltage in the pulse-doped structure FET.

FIG. 3 shows the change in transconductance in the pulse-doped structure GaAs MESFET 1. Referring to FIG. 3, the abscissa indicates a gate voltage $V_{gs}$, and the ordinate indicates a transconductance $g_m$. The transconductance $g_m$ remains at a constant value within a range A of the gate voltage $V_{gs}$. Such a characteristic cannot be found in a MESFET or HEMT (High Electron Mobility Transistor), which is formed by ordinary ion implantation. In the arrangement as illustrated in FIG. 1, the resistance of a gate bias resistor for determining the gate voltage of the MESFET 1, i.e., the resistance of the resistor 7 is set such that the gate voltage $V_{gs}$ has a voltage a within the range A.

When the transconductance $g_m$ is set at a constant value, the change in gate capacitance of the MESFET 1 is small. It is known, on the other hand, that FM noise $\Delta \omega^2$ of a high-frequency oscillator is proportional to the square of a ratio of a gate-source capacitance change $\partial C_d$ to a gate-source DC voltage change $\partial V_O$, i.e., $(\partial C_d / \partial V_O)^2$. This is described in detail in "MIC & MMIC AMPLIFIER AND OSCILLATOR CIR- CUIT DESIGN", Allen A. Sweet, Artech House, Boston, London.

In, therefore, the MESFET 1 in which the transconductance $g_m$ is set at a constant value and the gate capacitance change $\partial C_d$ is small, the value of $\overline{(\partial C_d/\partial V_O)^2}$ decreases. As a result, the value of the FM noise $\overline{\Delta \omega^2}$ proportional to this value decreases. Therefore, high-frequency signals are not interfered with by FM noise, unlike in conventional arrangements.

Note that although the high-frequency oscillator using the dielectric resonator 17 is described in the above embodiment, the present invention can be applied more effectively to high-frequency oscillators such as a voltage-controlled oscillator (VCO) which cannot use such a dielectric resonator. That is, although a dielectric resonator contributes to FM noise reduction to some extent, the present invention proves its merits when used in strict conditions where no dielectric resonator can be used.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A high-frequency oscillator comprising:
   a Schottky barrier field-effect transistor, and
   a resonator having an output connected to said field-effect transistor, said field-effect transistor being formed of a GaAs semiconductor, and a carrier concentration of an active layer of said field-effect transistor increasing stepwise at a predetermined depth.

2. An oscillator according to claim 1, further comprising means for setting a gate voltage of said field-effect transistor within a range in which a change in transconductance with respect to a change in the gate voltage remains constant.

3. An oscillator according to claim 1, wherein a gate of said Schotty barrier field effect transistor is doped to electrically connect with the resonator, and an output of said high frequency oscillator is provided in a drain of said Schottky barrier field effect transistor.

4. An oscillator according to claim 3, wherein the resonator comprises a dielectric resonator.

5. A method of reducing FM noise in a high-frequency oscillator which comprises a Schottky barrier field-effect transistor, and a resonator which has an output connected to said field-effect transistor, said field-effect transistor being formed of a GaAs semiconductor, and a carrier concentration of an active layer of said field-effect transistor increasing stepwise at a predetermined depth,
   said method comprising the step of setting the gate voltage of said field-effect transistor within a range in which a change in transconductance with respect to a change in the gate voltage remains constant.

* * * * *

UNITED STATES PATENT AND TRADEMARK OFFICE
CERTIFICATE OF CORRECTION

PATENT NO. : 5,164,686
DATED : November 17, 1992
INVENTOR(S) : Nobuo Shiga

It is certified that error appears in the above-identified patent and that said Letters Patent is hereby corrected as shown below:

```
Column 4, line 11,    delete "doped to"; and
Column 4, line 12,    change "connect" to -- connected --.
```

Signed and Sealed this

Twenty-fourth Day of October, 1995

Attest:

BRUCE LEHMAN

*Attesting Officer*    *Commissioner of Patents and Trademarks*